(12) United States Patent
Kim

(10) Patent No.: US 7,374,859 B2
(45) Date of Patent: May 20, 2008

(54) PROTECTIVE LAYERS COMPATIBLE WITH THICK FILM PASTES

(75) Inventor: Young H. Kim, Hockessin, DE (US)

(73) Assignee: E.I. du Pont de Nemours and Company, Wilmington, DE (US)

(*) Notice: Subject to any disclaimer, the term of this patent is extended or adjusted under 35 U.S.C. 154(b) by 0 days.

(21) Appl. No.: 10/713,606

(22) Filed: Nov. 14, 2003

(65) Prior Publication Data
US 2004/0137364 A1    Jul. 15, 2004

Related U.S. Application Data

(60) Provisional application No. 60/426,738, filed on Nov. 15, 2002.

(51) Int. Cl.
G03F 7/00 (2006.01)
G03F 7/004 (2006.01)

(52) U.S. Cl. .............. 430/270.1; 430/273.1; 430/311; 430/319

(58) Field of Classification Search ......... 430/270.1, 430/273.1, 311, 319
See application file for complete search history.

(56) References Cited

U.S. PATENT DOCUMENTS

| | | | |
|---|---|---|---|
| 4,373,019 A | 2/1983 | Watanabe et al. | |
| 4,833,067 A | 5/1989 | Tanaka et al. | |
| 4,939,070 A | 7/1990 | Brunsvold et al. | |
| 4,985,332 A | 1/1991 | Anderson et al. | |
| 5,164,286 A | 11/1992 | Blakeney et al. | |
| 5,362,927 A | 11/1994 | Ezaki | |
| 5,506,090 A * | 4/1996 | Gardner et al. | 430/302 |
| 5,601,638 A | 2/1997 | Fukuda et al. | |
| 5,756,267 A | 5/1998 | Matsuda et al. | |
| 5,910,392 A * | 6/1999 | Nozaki et al. | 430/270.1 |
| 5,942,367 A | 8/1999 | Watanabe et al. | |
| 6,060,207 A | 5/2000 | Shida et al. | |
| 6,060,213 A | 5/2000 | Kodama | |
| 6,060,841 A | 5/2000 | Niiyama | |
| 6,107,360 A * | 8/2000 | Kaneko et al. | 522/81 |
| 6,238,842 B1 | 5/2001 | Sato et al. | |
| 6,410,748 B1 | 6/2002 | Shida et al. | |
| 6,534,235 B1 | 3/2003 | Hanobata et al. | |
| 6,534,671 B2 | 3/2003 | Wu et al. | |
| 6,558,871 B1 | 5/2003 | Takahashi et al. | |
| 6,613,499 B2 | 9/2003 | Chang | |
| 6,653,043 B1 | 11/2003 | Hanobata | |

(Continued)

FOREIGN PATENT DOCUMENTS

EP    0936 504    8/1999

(Continued)

OTHER PUBLICATIONS

English LAnguage Abstract of JP 2000-108259.*

(Continued)

*Primary Examiner*—Amanda Walke

(57) ABSTRACT

This invention relates to novel processes comprising a protective polymer layer in the fabrication of electronic devices using thick film pastes. The protective polymer layer is fabricated from materials which are insoluble after irradiation in the ester-type solvents contained in the thick film paste. By appropriate selection of protective film polymers, the protective film can be compatible with the thick film paste.

20 Claims, 1 Drawing Sheet

U.S. PATENT DOCUMENTS

| | | |
|---|---|---|
| 6,769,945 B2 | 8/2004 | Chang et al. |
| 6,798,127 B2 | 9/2004 | Mao et al. |
| 6,803,423 B2 | 10/2004 | Hayakawa |
| 6,811,950 B2 | 11/2004 | Kondo |
| 7,125,648 B2 | 10/2006 | Nagase |
| 7,186,498 B2 | 3/2007 | Gries |
| 2002/0001720 A1 | 1/2002 | Clough |
| 2002/0058207 A1 | 5/2002 | Urano et al. |
| 2002/0074932 A1 | 6/2002 | Bouchard et al. |
| 2002/0094382 A1 | 7/2002 | Imai |
| 2002/0094483 A1 | 7/2002 | Hattori et al. |
| 2002/0106589 A1 | 8/2002 | Rodney et al. |
| 2003/0170559 A1 | 9/2003 | Mizutani et al. |
| 2004/0018453 A1 | 1/2004 | Anzures et al. |
| 2004/0137364 A1 | 7/2004 | Kim |
| 2004/0140861 A1 | 7/2004 | Alvarez |
| 2004/0170925 A1 | 9/2004 | Roach et al. |
| 2005/0058953 A1 | 3/2005 | Chai et al. |
| 2005/0112503 A1 | 5/2005 | Kanda et al. |
| 2005/0130082 A1 | 6/2005 | Kanda |
| 2005/0227168 A1 | 10/2005 | Kim et al. |
| 2005/0282094 A1 | 12/2005 | Kim et al. |
| 2006/0154158 A1 | 7/2006 | Washio |

FOREIGN PATENT DOCUMENTS

| | | |
|---|---|---|
| EP | 1184723 A2 * | 3/2002 |
| JP | 2000/108259 | 4/2000 |
| JP | 2000108259 A * | 4/2000 |
| JP | 2000/187327 | 7/2000 |
| JP | 2001-111217 | 4/2001 |
| JP | 2001/111217 | 4/2001 |
| JP | 2001/155626 | 6/2001 |
| JP | 2001-155626 | 8/2001 |
| WO | WO 2005/116761 A2 | 12/2005 |

OTHER PUBLICATIONS

Wang, et al. Proceedings of the SPIE—The International Society for Optical Engineering (1999) vol. 3906, pp. 619-624.

International Search Report Dated Nov. 14, 2003.

Wun-Ku Wang et. al., Electrical Characterization of Polymer Thick Film Resistor, The International Society for Optical Engineering, 1999, vol. 3906:619-624.

J.V. Crivello, The Chemistry of Photoacid Generating Compounds in Polymeric Materials Science and Engineering, American Chemical Society Meeting, 1989, vol. 61:62-66.

T.A. Pressley, Method Development for Semivolatile Organics in Municipal Sludge, American Chemical Society Meeting, 1989, vol. 62-66.

Chen et. al., Solution Properties of Single-Walled Carbon Nanotubes, Science, 1998, vol. 282:95-98.

Zhaoxia et. al., Nonliner Optical Properties of Some Polymer/Multi-Walled Carbon Nanotube Composites, Chemical Physics Letters, 2000, vol. 318:505-510.

M. Dresselhaus et. al., Physics World-Physics Web, Carbon Nanotube, 1998, pp. 1-10.

S.L. Rosen, Polymers, The Kirk-Othmer Encyclopedia of Chemical Technology, Fourth Edition, John Wiley & Sons, pp. 881-904, vol. 19.

* cited by examiner

PROTECTIVE LAYERS COMPATIBLE WITH THICK FILM PASTES

CROSS REFERENCE TO RELATED APPLICATIONS

This application claims the benefit of U.S. Provisional Application. No. 60/426,738, filed on Nov. 15, 2002.

FIELD OF THE INVENTION

The present invention relates to a process for using a special protective layer for the fabrication of electronic devices that use thick film pastes.

TECHNICAL BACKGROUND

The present invention relates to a process for constructing electronic devices wherein a substrate is coated with a conducting layer that is further coated with a thick film paste. The thick film paste may contain materials such as glass frit, various conductors, photo-imageable polymers and, usually a solvent. In the fabrication of these devices photo-definable protective layers may be used to isolate photoimageable thick film deposits from other elements of these electronic devices such as conductive layers. A problem arises in some of these devices in that the solvent used in the thick film pastes, usually an ester or ether type solvent, is frequently aggressive to the polymer protective layer and may lead to short circuits. This can lead to problems on the surface of the substrate such as pealing or dissolution of the of the protective layer from the substrate when that layer is exposed to the thick film paste.

Wang et al in the Proceedings of the SPIE—The International Society for Optical Engineering (1999) vol. 3906, p. 619-24 describe the electrical characterization of polymer thick film resistors.

Fukuda et al (U.S. Pat. No. 5,601,638) describes a thick film paste for use in the formation of circuit components.

Ezaki (U.S. Pat. No. 5,362,927) reports a thick film hybrid circuit board device formed by lamination.

Kazunori et al (JP 2001155626 A) provide a method for producing a display substrate.

Takehiro and Shigeo (JP10340666 A) describe a field emission element.

Kazunori and Shinsuke ((JP 2001111217 A) provide a method of forming laminated wiring.

The present invention addresses the problem of incompatability of the thick film paste and the protective layers on the substrate by fabricating a protective layer from positive photo-imageable materials which do not degrade or dissolve upon contact with the high boiling ester-type or ether-type solvents found in the photo-imageable thick film pastes.

SUMMARY OF THE INVENTION

The present invention addresses the problem of compatibility of the thick film paste with a protective layer by fabricating a protective layer from positive photo-imageable materials made of polymers with pendant acid labile groups which do not degrade or dissolve upon contact with the high boiling ester-type or ether-type solvents found in the photo-imageable thick film pastes, e.g. such solvents include butyl carbitol, butyl carbitol acetate, dibutyl carbitol, dibutyl phthalate, texanol and terpineol.

The invention is a process for making an electronic device comprising:

coating an electronic device structure with a positive photo-imageable protective layer comprising a polymer in which at least 50 mole percent of the monomers in the polymer comprise a structure selected from the group consisting of:

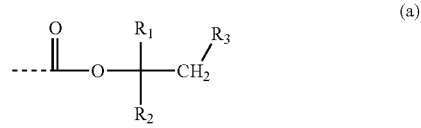

(a)

where $R_1$ is hydrogen or lower alkyl; $R_2$ is a lower alkyl; and $R_3$ is hydrogen or a lower alkyl where the definition of lower alkyl includes alkyl groups having 1 to 6 linear or cyclic carbon atoms;

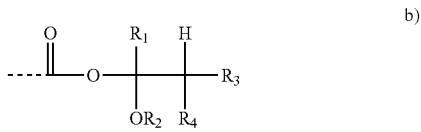

b)

where $R_1$ is hydrogen or lower alkyl; $R_2$ is a lower alkyl; and $R_3$ and $R_4$ are independently hydrogen or a lower alkyl where the definition of lower alkyl includes alkyl groups having 1 to 6 carbon atoms and the joining of $R_1$ and $R_2$, or $R_1$ and either $R_3$ or $R_4$, or $R_2$ and either $R_3$ or $R_4$ to form a 5-, 6-, or 7-membered ring; and

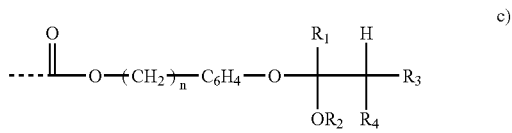

c)

where $R_1$ is hydrogen or lower alkyl; $R_2$ is a lower alkyl; and $R_3$ and $R_4$ are independently hydrogen or a lower alkyl where the definition of lower alkyl includes alkyl groups having 1 to 6 carbon atoms and the joining of $R_1$ and $R_2$, or $R_1$ and either $R_3$ or $R_4$, or $R_2$ and either $R_3$ or $R_4$ to form a 5-, 6-, or 7-membered ring.

Suitable polymers for the above process are selected from the group consisting of 1-ethoxyethyl methacrylate, 1-ethoxyethyl acrylate, 1-butoxyethyl methacrylate, 1-butoxyethyl acrylate, 1-ethoxy-1-propyl methacrylate, 1-ethoxy-1-propyl acrylate, tetrahydropyranyl methacrylate, tetrahydropyranyl acrylate, tetrahydropyranyl p-vinylbenzoate, 1-ethoxy-1-propyl p-vinylbenzoate, 4-(2-tetrahydropyranyloxy)benzyl methacrylate, 4-(2-tetrahydropyranyloxy)benzyl acrylate, 4-(1-butoxyethoxy)benzyl methacrylate, 4-(1-butoxyethoxy)benzyl acrylate t-butyl methacrylate, t-butyl acrylate, neopentyl methacrylate, neopentyl acrylate, 1-Bicyclo{2,2,2}octyl methacrylate (or acrylate) and their derivatives, 1-Bicyclo{2,2,1}heptyl methacrylate (or acrylate) and their derivatives, 1-Bicyclo{2,1,1}hexyl methacrylate (or acrylate) and their derivatives, 1-Bicyclo{1,1,1}pentyl methacrylate (or acrylate) and their derivatives and 1-adamantyl methacrylate (or acrylate) and their derivatives.

In a preferred embodiment, the process further comprises adding to the photo-imageable polymer 0.5-30 mole % of photoacid generator and 10-1000 ppm of photosensitizer.

The invention also includes electronic devices fabricated by the above process.

DETAILED DESCRIPTION

Figure 1:
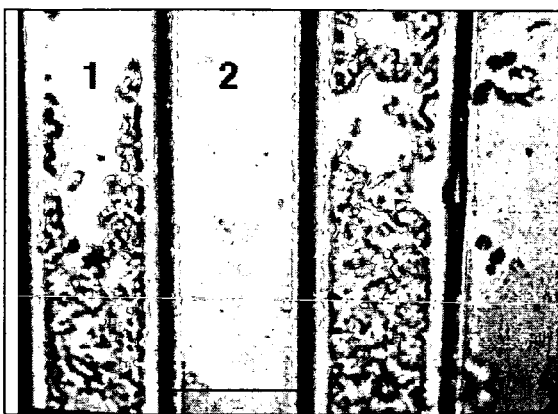
FIG. 1 shows a photomask grid of a photoresist of the present invention irradiated 120 seconds through a mask followed by heating 10 minutes at 110 C and then washed with carbonate and air dried.

Currently, "novalac-type" of phenolic formaldehyde polymeric materials are typically used as protective layers in the fabrication process of electronic devices utilizing photo-imageable thick film pastes, such as Fodel® silver paste commericalized by DuPont, Wilmington Del. The role of such a protective layer is to maintain spacing between the thick film deposit and other substrate structures to prevent contamination of the bottom substrate with the thick film paste. As mentioned above, in some cases, contamination of the bottom substrate may lead to short circuits. The protective layer is then removed by dissolution along with the unimaged thick film material is removed. However, these protective layers are frequently found to be damaged during the process of applying the paste materials on the top of the protective layer. The cause of the damage is either the dissolution of the protective layer by solvent vapors generated during the paste drying process or plastic deformation of the resist material due to plastization by these vapors. Butyl carbitol, butyl carbitol acetate, dibutyl carbitol, dibutyl phthalate, texanol and terpineol are examples of the solvents currently used in thick film paste formulation.

The present invention uses protective materials that show either lower solubility or improved compatibility toward high boiling ester-type or ether-type solvent vapor so as to reduce the damage of the protective layer. New polymers to be used as a protective layers in electronic device fabrication using photo-imageable thick film pastes must be soluble in an organic solvent so that the polymer can be applied as a thin film on the top of prefabricated device layers. Upon either chemical treatment or photo-irradiation the polymer becomes impervious to ester-type or ether-type organic solvents used in the formulation of the thick film paste. Since the polymer must undergo a photo-imaging step to be used as the protective layer, it must be formulated with a photo-responsive agent. A preferred polymer for this function contains a labile pendant group on a side acid functional group, which can be removed from the polymer pendant group at an appropriate time. One type of pendant acid labile groups useful in the compositions of this invention can be described by the formulae:

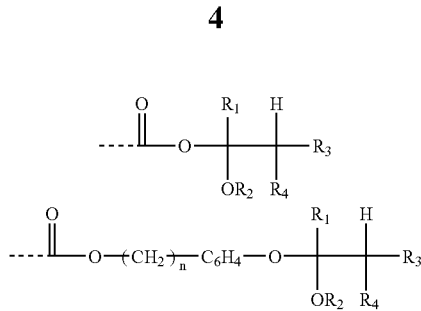

where
n=0 to 4;
$R_1$ is hydrogen or lower alkyl; $R_2$ is lower alkyl; and $R_3$ and $R_4$ independently are hydrogen or lower alkyl where the definition of lower alkyl includes alkyl groups having 1 to 6 carbon atoms and the joining of $R_1$ and $R_2$, or $R_1$ and either $R_3$ or $R_4$, or $R_2$ and either $R_3$ or $R_4$ may be joined to form a 5-, 6-, or 7-membered ring.

Some examples of acid labile monomeric components that fall within the scope of the invention when used to prepare the polymeric material are:
1-ethoxyethyl methacrylate (or acrylate),
1-butoxyethyl methacrylate (or acrylate),
1-ethoxy-1-propyl methacrylate (or acrylate),
tetrahydropyranyl methacrylate (or acrylate),
tetrahydropyranyl p-vinylbenzoate,
1-ethoxy-1-propyl p-vinylbenzoate, 4-(2-tetrahydropyranyloxy)benzyl methacrylate (or acrylate),
4-(1-butoxyethoxy)benzyl methacrylate (or acrylate).

This is not meant to be a comprehensive list and the invention is not limited to these materials.

Another type of pendant acid labile groups useful in the compositions of this invention can be described by the formulae:

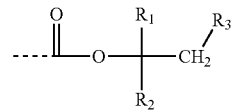

$R_1$ is hydrogen or lower alkyl; $R_2$ is lower alkyl; and $R_3$ is hydrogen or lower alkyl where the definition of lower alkyl includes alkyl groups having 1 to 6 linear or cyclic carbon atoms Some examples of acid labile monomeric components that fall within the scope of the invention when used to prepare the polymeric material are:
t-butyl methacrylate (or acrylate),
Neopentyl methacrylate (or acrylate)
1-Bicyclo{2,2,2}octyl methacrylate (or acrylate) and their derivatives
1-Bicyclo{2,2,1}heptyl methacrylate (or acrylate) and their derivatives
1-Bicyclo{2,1,1}hexyl methacrylate (or acrylate) and their derivatives
1-Bicyclo{1,1,1}pentyl methacrylate (or acrylate) and their derivatives
1-adamantyl methacrylate (or acrylate) and their derivatives This is not meant to be a comprehensive list and the invention is not limited to these materials.

The preferred molecular weight of these polymers is 7,000-1,000,000. It is also desirable to use copolymers, either random or block copolymers of monomer units containing those acid labile side groups and some other monomers which do not have acid labile pendant groups but have hydrophilic groups such as ethylene glycol ethers or carboxylic acid groups. Molecular weights higher than typical photoresist known in the field are preferred since the remaining polymer film has to withstand certain mechanical processes, such as screen printing. Mechanical stress is applied to the film with a rubber squeeze during or after the screen printing. In order to improve organic solvent resistance, it would be desirable to have a high amount of acid after the removal of the labile groups. The amount of monomer in the copolymer suitable for imperviousness to the organic vapor depends on the types of organic solvent used with the paste. The preferred mole fraction for the monomer containing labile ester group is 50%, and the more preferred mole percentage is higher than 60%.

Block copolymers can be prepared by well know methods in art, using methods typically known as living or controlled polymerization, like anionic or group transfer polymerization as well as atom transfer polymerization. The terms and techniques regarding living, controlled, and atom transfer polymerization are discussed in "Controlled/Living Radical Polymerization", edited by K. Matyjaszewski, Oxford University Press. Random copolymers can be obtained by solution polymerization using typical free radical initiator, such as organic peroxide and azo initiators. Discussion of these polymerization methods can be found in "Polymer Chemistry" Fifth Edition by C. E. Carraher Jr, Marcel Dekker Inc., New York, N.Y. (see Chapters 7, 8 and 9) or "Polymers" by S. L. Rosen in The Kirk-Othmer Encyclopedia of Chemical Technology, Fourth Edition, John Wiley and Sons Inc., New York (see volume 19, pp 899-901).

The photo initiator is selected from common photo acid generators, such as aromatic sulfonium phosphofluoride or antimony fluoride, or aromatic iodonium salt with similar anions. The photo acid generators, and examples of such compounds, are described in a paper by J. V. Crivello, "The Chemistry of Photoacid Generating Compounds" in Polymeric Materials Science and Engineering, Vol. 61, American Chemical Society Meeting, Miami, Fla., Seot. 11-15, 1989, pp. 62-66 and references therein. The selected photo acid generator should not undergo decomposition or dissolution during the development stage. Nonionic photoacid generators, such as PI-105 (Midori Kagaku Co, Tokyo, Japan) or high moleuclar weight photo acid generators, such as Cyracure UVI 6976 (Dow, Midland, Mich.), CD-1012 (Aldrich Chemical, Milwaukee, Wis.) are examples of such photo acid generators.

To fabricate a device using the present invention, a 0.5 to 5 micron thick polymer coating of polymers with pendant labile acid groups and photo-active reagents is applied to a substrate. Such coatings could be achieved by spin coating or table coating using a blade in an appropriate organic solvent. The preferred organic solvents for applying the coating are Propylene Glycol 1-Monomethyl Ether 2-Acetate (PGMEA) or cyclohexanone. Next, the solvent is removed by heating the substrate to between 70 to 100 C for typically 1 to 3 minutes on a hot plate. The coating is now ready to be patterned by UV photo-irradiation. UV irradiation followed by heat treatment will cleave acid labile pendant group to convert the ester to the acid. The UV photoirradiation source may use 193 nm laser radiation or a mercury lamp. For the higher wavelength than 248 nm may require addition of a small amount (10-1000 ppm) of photosensitizer which increases the absorption of UV light. The examples of photosensitizer include, but not limited to isopropylthioxanthone (ITX), 2,4-Diethyl-9H-thioxanthen-9-one (DETX), benzophenone. UV irradiation dose is 50 to 1000 mJ/square centimeter. Post exposed baking conditions are typically 120 to 140 C for 1 to 3 minutes. This treatment results the exposed area being soluble in a aqueous base developing solvent. The basic developing solvents may include a carbonate solution or a low concentration sodium or potassium hydroxide solution. Preferably, commercial aqueous base developer, such as AZ 300, 400 or 500, obtained from Clariant Corporation, AZ Electronic Materials Somerville, N.J. 08876-1258, can be used. After development, a patterned template is formed. The remaining protective film is still soluble in organic solvents, thus its protective function toward the thick film paste is limited. The film can be converted to a film containing a high level of polycarboxylic acid which is insoluble in the common organic solvents employed in thick film pastes by exposure to UV light and subsequent heat treatment. The UV irradiation dose is 50 to 2000 mJ/square centimeter. Post exposed baking conditions are typically 120 to 140 C for 1 to 3 minutes.

The negatively imageable thick film paste of interest is aqueous base developable paste, such as Fodel silver paste commercialized by DuPont, Wilmington Del. It also includes such paste containing carbon nanotubes for field emission display applications. Thick film paste is applied on the top of the converted protective layer by such methods as screen printing, filling the vacancies in the patterned template generated by photo development. Subsequently, the thick film paste is photo irradiated from the back side of the structure. The paste located in the patterned template where the protective film is removed by photoimaging would be imaged preferentially. The paste is negatively developed upon irradiation, so that the paste becomes insoluble to developing solvents. Typically, these thick film pastes are developed by gentle spray of an aqueous base solution. The unimaged paste is washed out within certain time which is called the time-to-clear (TCC). Typically, the spray will last 1.5 to 3.0 times the TTC. The irradiated protective layer is soluble in the aqueous base solution so that it is removed while the unimaged thick film paste is being removed as it is spray developed.

EXAMPLES

Example 1

1.5 grams of poly(ethoxytriethylene glycol methacrylate-b-t-butyl methacrylate), with degree of polymerization (D.P.) of 37/100 and number average molecular weight (Mn) of 28,600, was used. To this was added 0.5 grams Cyracure® UVI-6976 (Dow Chemical), and 0.002 grams Quanticure ITX (Aldrich). All additions were dissolved to a clear solution in 4 ml 2-butanone. Using a 2 mil doctor blade, the solution was cast on MYLAR® (DuPont, Wilmington, Del.) film and allowed to air dry for 10 minutes. The film was then dried for 30 minutes in a 100° C. convection oven. The dried film was cut into 2.5×2.5 cm squares. The film was treated according to the following procedure and examined after each step.

Figure 2:
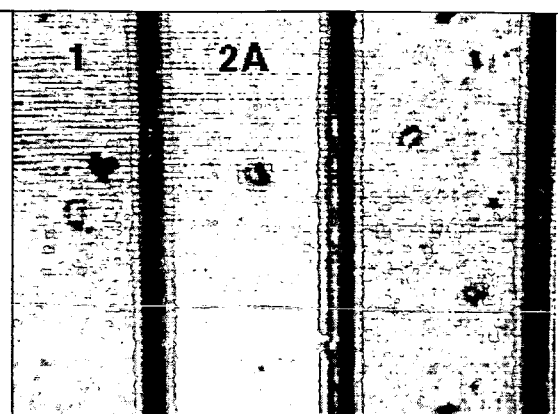
FIG. 2 shows the grid of FIG. 1 following further irradiation without mask followed by heating 10 minutes at 110 C.
Figure 3:
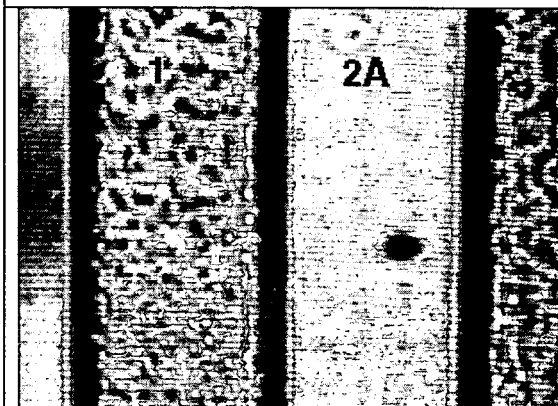
FIG. 3 shows the grid of FIG. 2 after washing with ethyl acetate solvent.
Figure 4:
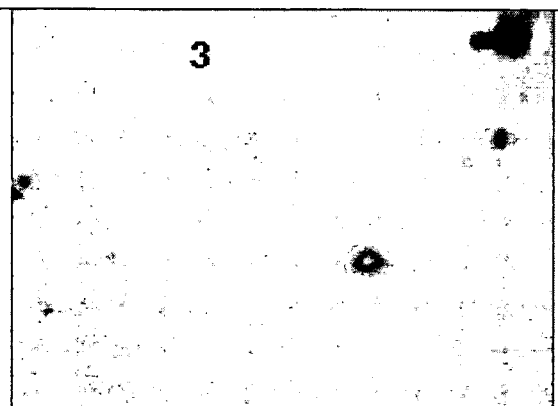
FIG. 4 shows the grid of FIG. 3 after washing with carbonate solution.

A film square was placed in a Plexiglas® sample holder and backed by KAPTON® (DuPont, Wilmington, Del.) film. A 50 micron photomask grid was placed over the top of the film and held in place by a large glass disk. The film was exposed to UV light for 120 seconds. The exposed film was then heated to 110° C. for 10 minutes on a hot plate. The film was washed for 60 seconds using a spray gun with a 0.5% solution of sodium carbonate, followed by a 30 second rinse with distilled water. The film was dried with a stream of $N_2$. FIG. 1 shows the alternating grid of UV irradiated and unirradiated film. In the region designated 1, the irradiated film is dissolved away by the carbonate solution. In the unirradiated, masked region, designated 2, the film is still present. The film was then heated to 110° C. for 10 minutes on a hot plate. The film was exposed a second time for 120 seconds with no photomask. The film was then heated to 110° C. for 10 minutes on a hot plate. FIG. 2 shows the film after irradiation. The area designated 2A has now been irradiated. The surface of the film was washed with ethyl acetate soaked on a Q-Tip and allowed to dry. The ethyl acetate simulates the solvents present in a thick film paste. FIG. 3 shows that the area of the film 2A is still intact after exposure to the ethyl acetate. The film was washed for 60 seconds with a 0.5% solution of sodium carbonate, followed by a 30 second rinse with distilled water. The film was dried with a stream of $N_2$. FIG. 4 shows all of the film has been dissolved.

Example 2

0.183 grams of a copolymer of poly(ethoxytriethylene glycol acrylate-random-t-butyl methacrylate), (mole ratio of 30:70 of monomers, Mn=10,400, and a polydispersity, PD=2.8), 0.045 grams of DP=5 homopolymer of t-butyl methacryllate, 0.081 grams Cyracure® UVI-6976 (Dow Chemical), and 0.13 milligrams Quanticure ITX (Aldrich) and 0.13 mg of 2,3-Diazabicyclo[3.2.2]non-2-ene, 1,4,4-trimethyl-, 2,3-dioxide (TAOBN) (Hampford Research, Inc. P.O. Stratford, Conn. 06615) were dissolved to a clear solution in 0.424 grams of PGMEA. Using a 2 mil doctor blade, the solution was cast on a glass plate and allowed to air dry for 10 minutes. The film was then dried for 2 min at 70 deg C. hot plate. The film was exposed with approximate 600 mJ/cm2 broad band UV light using a 20 micron photomask, then heat treated on a hot plate at 120 deg C. for 2 min. The imaged part was developed by dipping into a 0.5% sodium carbonate solution. The film was washed with deionized water for 1 min., then dried on a hot plate at 70 deg C. for 1 min. The remaining film was flood exposed with 600 mJ/cm2 then heat treated at 120 deg C. for 2 mins. The remaining film could be washed out with a 0.5% sodium carbonate solution.

Example 3

0.183 grams of a copolymer of poly(ethoxytriethylene glycol acrylate-random-t-butyl methacrylate), (mole ratio of 70:30 of the monomers, Mn=10,400), 0.045 grams of DP=5 homopolymer of t-butyl methacryllate, 0.081 grams Cyracure® UVI-6976 (Dow Chemical), and 0.13 milligrams Quanticure ITX (Aldrich) and 0.02 g of BHT were dissolved to a clear solution in 0.424 g of PGMEA. Using a 2 mil doctor blade, the solution was cast on a glass plate and allowed to air dry for 10 minutes. The film was then dried for 2 min at 70 deg C. hot plate. The film was exposed with approximate 600 mJ/cm2 broad band UV light using a 20 micron photomask, then heat treated on a hot plate at 120 deg C. for 2 min. The Imaged part was developed by dipping into a 0.5% sodium carbonate solution. The film was washed with deionized water for 1 min., then dried on a hot plate at 70 deg C. for 1 min. The remaining film was flood exposed with 600 mJ/cm2 then heat treated at 120 deg C. for 2 mins. The remaining film could be washed out with a 0.5% sodium carbonate solution.

Example 4

1.097 grams of a copolymer of poly(methylmethacrylate-random-methacrylic acid-random-t-butyl methacrylate), (mole ratio of 50:50:100 of the monomers, Mn=70,000, PD=3.1), 0.272 grams of DP=5 homopolymer of t-butyl methacryllate 0.485 grams Cyracure® UVI-6976, and 0.08 grams Quanticure ITX (Aldrich) and 0.08 grams of TAOBN were dissolved to a clear solution in 2.546 grams of PGMEA. Using a 2 mil doctor blade, the solution was cast on a glass plate and allowed to air dry for 10 minutes. The film was then dried for 2 min at 70 degrees C. hot plate. The film was exposed with approximate 1500 mJ/cm2 broad band UV light using a 20 micron photomask, then heat treated on a hot plate at 120 degrees C. for 2 min. The imaged part was developed by dipping into a 0.5% sodium carbonate solution.

What is claimed is:

1. In an electronic device that comprises a substrate having conductive properties, a process for fabricating a protective layer, comprising (a) applying to the substrate a photopolymerizable protective layer composition to form a protective layer thereon, wherein the protective layer composition consists essentially of a polymer comprising, as polymerized units, monomers of which at least 50 mole percent comprise a structure selected from the group consisting of:

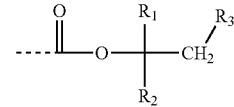

wherein $R_1$ is hydrogen or lower alkyl, $R_2$ is lower alkyl, and $R_3$ is hydrogen or lower alkyl; wherein lower alkyl includes alkyl groups having 1 to 6 linear or cyclic carbon atoms;

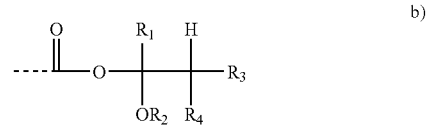

wherein $R_1$ is hydrogen or lower alkyl, $R_2$ is lower alkyl, and $R_3$ and $R_4$ are independently hydrogen or lower alkyl; wherein lower alkyl includes alkyl groups having 1 to 6 carbon atoms, and the joining of $R_1$ and $R_2$, or $R_1$ and either $R_3$ or $R_4$, or $R_2$ and either $R_3$ or $R_4$ to form a 5-, 6-, or 7-membered ring;

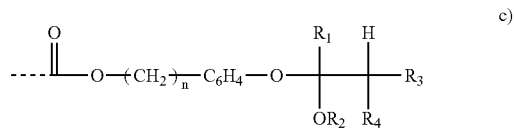

wherein $R_1$ is hydrogen or lower alkyl, $R_2$ is lower alkyl, and R and $R_4$ are independently hydrogen or lower alkyl; wherein lower alkyl includes alkyl groups having 1 to 6 carbon atoms, and the joining of $R_1$ and $R_2$, or $R_1$ and either $R_3$ or $R_4$, or $R_2$ and either $R_3$ or $R_4$ to form a 5-, 6-, or 7-membered ring; and n is 0 to 4; and (IV) mixtures of (I), (II) and/or (III);

(b) irradiating the protective layer through a mask;

(c) heating the device;

(d) contacting the protective layer with a developing solution to remove the portions of the protective layer composition exposed to radiation in step (b) and form a patterned protective layer;

(e) irradiating the patterned protective layer; and (f) heating the device.

2. The process of claim 1 wherein the polymer comprises, as polymerized units, monomers of which at least 60 mole percent comprise a structure selected from the group consisting of (I), (II), (III) and (IV).

3. The process of claim 1 wherein the polymer comprises, as polymerized units, a monomer selected from the group consisting of 1-ethoxyethyl methacrylate (or acrylate), 1-butoxyethyl methacrylate (or acrylate), 1-ethoxy-1-propyl methacrylate (or acrylate), tetrahydropyranyl methacrylate (or acrylate), tetrahydropyranyl p-vinylbenzoate, 1-ethoxy-1-propyl p-vinylbenzoate, 4-(2-tetrahydropyranyloxy)benzyl methacrylate (or acrylate), 4-(1-butoxyethoxy)benzyl methacrylate (or acrylate); and mixtures thereof.

4. The process of claim 1 wherein the polymer comprises, as a polymerized unit, a monomer selected from the group consisting of t-butyl methacrylate (or acrylate); neopentyl methacrylate (or acrylate); 1-bicyclo{2,2,2}octyl methacrylate (or acrylate) and their derivatives; 1-bicyclo{2,2,1}heptyl methacrylate (or acrylate) and their derivatives; 1-bicyclo{2,1,1}hexyl methacrylate (or acrylate) and their derivatives; 1-bicyclo{1,1,1}pentyl methacrylate (or acrylate) and their derivatives; 1-adamantyl methacrylate (or acrylate) and their derivatives; and mixtures thereof.

5. The process of claim 1 wherein the polymer comprises, as a polymerized unit, up to about 10 mole percent of a monomer selected from methyl methacrylate, methyl acrylate, methacrylic acid, and hydroxyl ethyl methacrylate; and mixtures thereof.

6. The process of claim 1 wherein the protective layer composition further consists essentially of 0.5-30 mole % of photoacid generator and 10-1000 ppm of photosensitizer.

7. The process of claim 1 wherein the protective layer composition has a molecular weight in the range of about 7,000 to about 1,000,000.

8. The process of claim 1 wherein the polymer comprises a copolymer.

9. The process of claim 1 wherein the polymer comprises, as a polymerized unit, a monomer having a hydrophilic group.

10. A process for fabricating an electronic device that comprises a substrate having conductive properties, comprising (a) applying to a first side of the substrate a photopolymerizable protective layer composition to form a protective layer thereon, wherein the protective layer composition consists essentially of a polymer comprising, as polymerized units, monomers of which at least 50 mole percent comprise a structure selected from the group consisting of:

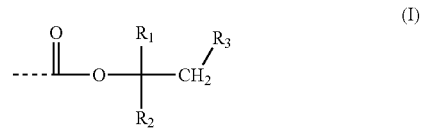

wherein $R_1$ is hydrogen or lower alkyl, $R_2$ is lower alkyl, and $R_3$ is hydrogen or lower alkyl; wherein lower alkyl includes alkyl groups having 1 to 6 linear or cyclic carbon atoms;

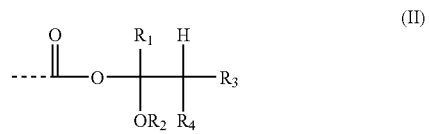

wherein $R_1$ is hydrogen or lower alkyl, $R_2$ is lower alkyl, and $R_3$ and $R_4$ are independently hydrogen or lower alkyl; wherein lower alkyl includes alkyl groups having 1 to 6 carbon atoms, and the joining of $R_1$ and $R_2$, or $R_1$ and either $R_3$ or $R_4$, or $R_2$ and either $R_3$ or $R_4$ to form a 5-, 6-, or 7-membered ring;

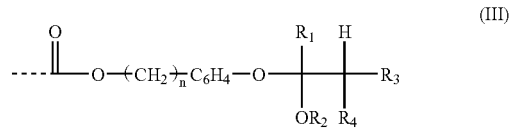

wherein $R_1$ is hydrogen or lower alkyl, $R_2$ is lower alkyl, and R and $R_4$ are independently hydrogen or lower alkyl; wherein lower alkyl includes alkyl groups having 1 to 6 carbon atoms, and the joining of $R_1$ and $R_2$, or $R_1$ and either $R_3$ or $R_4$, or $R_2$ and either $R_3$ or $R_4$ to form a 5-, 6-, or 7-membered ring; and n is 0 to 4; and (IV) mixtures of (I), (II) and/or (III);

(b) irradiating the protective layer trough a mask;

(c) heating the device;

(d) contacting the protective layer with a developing solution to remove the portions of the protective layer composition exposed to radiation in step (b) and form a patterned protective layer;

(e) irradiating the patterned protective layer;

(f) heating the device;

(g) applying to the patterned protective layer a paste composition;

(h) irradiating the device from a second side of the substrate to form a pattern in the paste composition; and (i) contacting the paste composition and the patterned protective layer with a developing solution to remove (I) the portions of the paste composition not exposed to radiation in step (h), and (II) the patterned protective layer.

11. The process of claim 10 wherein the polymer comprises, as polymerized units, monomers of which at least 60 mole percent comprise a structure selected from the group consisting of (I), (II), (III) and (IV).

12. The process of claim 10 wherein the polymer comprises, as polymerized units, a monomer selected from the group consisting of 1-ethoxyethyl methacrylate (or acrylate), 1-butoxyethyl methacrylate (or acrylate), 1-ethoxy-1- propyl methacrylate (or acrylate), tetrahydropyranyl methacrylate (or acrylate), tetrahydropyranyl p-vinylbenzoate, 1-ethoxy-1-propyl p-vinylbenzoate, 4-(2-tetrahydropyranyloxy)benzyl methacrylate (or acrylate), 4-(1-butoxyethoxy) benzyl methacrylate (or acrylate); and mixtures thereof.

13. The process of claim 10 wherein the polymer comprises, as a polymerized unit, a monomer selected from the group consisting of t-butyl methacrylate (or acrylate); neopentyl methacrylate (or acrylate); 1-bicyclo{2,2,2}octyl methacrylate (or acrylate) and their derivatives; 1-bicyclo{2,2,1}heptyl methacrylate (or acrylate) and their derivatives; 1-bicyclo{2,1,1}hexyl methacrylate (or acrylate) and their derivatives; 1-bicyclo{1,1,1}pentyl methacrylate (or acrylate) and their derivatives; 1-adamantyl methacrylate (or acrylate) and their derivatives; and mixtures thereof.

14. The process of claim 10 wherein the polymer comprises, as a polymerized unit, up to about 10 mole percent of a monomer selected from methyl methacrylate, methyl acrylate, methacrylic acid, and hydroxyl ethyl methacrylate; and mixtures thereof.

15. The process of claim 10 wherein the protective layer composition further consists essentially of 0.5-30 mole % of photoacid generator and 10-1000 ppm of photosensitizer.

16. The process of claim 10 wherein the protective layer composition has a molecular weight in the range of about 7,000 to about 1,000,000.

17. The process of claim 10 wherein the polymer comprises a copolymer.

18. The process of claim 10 wherein the polymer comprises, as a polymerized unit, a monomer having a hydrophilic group.

19. The process of claim 10 wherein the paste composition comprises silver.

20. The process of claim 10 wherein the paste composition comprises carbon nanotubes.

* * * * *